United States Patent
Hayafuji et al.

(10) Patent No.: US 8,891,596 B2
(45) Date of Patent: Nov. 18, 2014

(54) HIGH FREQUENCY FRONT END MODULE

(71) Applicant: Murata Manufacturing Co., Ltd., Nagaokakyo (JP)

(72) Inventors: Hisao Hayafuji, Nagaokakyo (JP); Koji Furutani, Nagaokakyo (JP)

(73) Assignee: Murata Maufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/182,640

(22) Filed: Feb. 18, 2014

(65) Prior Publication Data

US 2014/0169422 A1    Jun. 19, 2014

Related U.S. Application Data

(63) Continuation of application No. PCT/JP2012/070170, filed on Aug. 8, 2012.

(30) Foreign Application Priority Data

Aug. 24, 2011    (JP) ................................ 2011-182188

(51) Int. Cl.
| | |
|---|---|
| *H04B 1/38* | (2006.01) |
| *H04L 5/16* | (2006.01) |
| *H04B 1/40* | (2006.01) |
| *H03H 7/40* | (2006.01) |
| *H03H 7/46* | (2006.01) |
| *H04B 1/00* | (2006.01) |
| *H04B 1/48* | (2006.01) |

(52) U.S. Cl.
CPC . *H04B 1/40* (2013.01); *H03H 7/40* (2013.01); *H03H 7/465* (2013.01); *H04B 1/0057* (2013.01); *H04B 1/48* (2013.01)
USPC ................. 375/219; 710/1; 455/73

(58) Field of Classification Search
USPC ....................................................... 375/219
See application file for complete search history.

(56) References Cited

U.S. PATENT DOCUMENTS

| | | | |
|---|---|---|---|
| 4,480,237 A | 10/1984 | Yamada | |
| 8,633,618 B2 * | 1/2014 | Iijima et al. | ................... 307/109 |

(Continued)

FOREIGN PATENT DOCUMENTS

| | | | |
|---|---|---|---|
| JP | 58-057813 A | 4/1983 | |
| JP | 06-053772 A | 2/1994 | |

(Continued)

OTHER PUBLICATIONS

Official Communication issued in International Patent Application No. PCT/JP2012/070170, mailed on Sep. 11, 2012.

*Primary Examiner* — Erin File
(74) *Attorney, Agent, or Firm* — Keating & Bennett, LLP (57) ABSTRACT

A high frequency front end module includes a variable circulator, a transmission side filter, and a reception side filter. Capacitors that are to be selectively connected by a switch are provided between an antenna side port and a transmission side port of a circulator of the variable circulator. Capacitors that are to be selectively connected by a switch are provided between the antenna side port and a reception side port of the circulator. Capacitors that are to be selectively connected by a switch are provided between the transmission side port and the reception side port of the circulator. By selecting the capacitors, phase characteristics between the ports are adjusted to the characteristics in accordance with a transmission signal and a reception signal to be transmitted.

20 Claims, 7 Drawing Sheets

(56) References Cited

U.S. PATENT DOCUMENTS

| | | | |
|---|---|---|---|
| 2008/0242239 A1* | 10/2008 | Wilson et al. | 455/83 |
| 2008/0279287 A1* | 11/2008 | Asahina | 375/242 |
| 2009/0206942 A1 | 8/2009 | Furuta et al. | |
| 2009/0253385 A1 | 10/2009 | Dent et al. | |
| 2009/0310662 A1* | 12/2009 | Kato et al. | 375/224 |
| 2010/0135193 A1 | 6/2010 | Przadka | |
| 2011/0074220 A1* | 3/2011 | Iijima et al. | 307/109 |
| 2011/0117862 A1* | 5/2011 | Bagger et al. | 455/77 |
| 2011/0175789 A1* | 7/2011 | Lee et al. | 343/853 |
| 2013/0038505 A1* | 2/2013 | Iijima et al. | 343/876 |
| 2013/0070836 A1* | 3/2013 | Singerl et al. | 375/238 |

FOREIGN PATENT DOCUMENTS

| | | |
|---|---|---|
| JP | 2000-323961 A | 11/2000 |
| JP | 2003-060409 A | 2/2003 |
| JP | 2004-072549 A | 3/2004 |
| JP | 2005-318293 A | 11/2005 |
| JP | 2008-271541 A | 11/2008 |
| JP | 2009-147878 A | 7/2009 |
| JP | 2009-225425 A | 10/2009 |
| JP | 2010-528498 A | 8/2010 |
| JP | 2011-521508 A | 7/2011 |
| WO | 00/52841 A1 | 9/2000 |
| WO | 2006/022132 A1 | 3/2006 |

* cited by examiner

FIG. 1

Prior Art

HIGH FREQUENCY FRONT END MODULE

BACKGROUND OF THE INVENTION

1. Field of the Invention

The present invention relates to high frequency front end modules that transmit and receive a plurality of communication signals having different communication frequency bands via a common antenna configured for the plurality of communication signals.

2. Description of the Related Art

To date, a variety of high frequency front end modules that transmit and receive a plurality of communication signals having different communication frequency bands have been put into practical use. Among these, there is a high frequency front end module that transmits and receives a plurality of communication signals via a common antenna configured for the plurality of communication signals.

Figure 1:
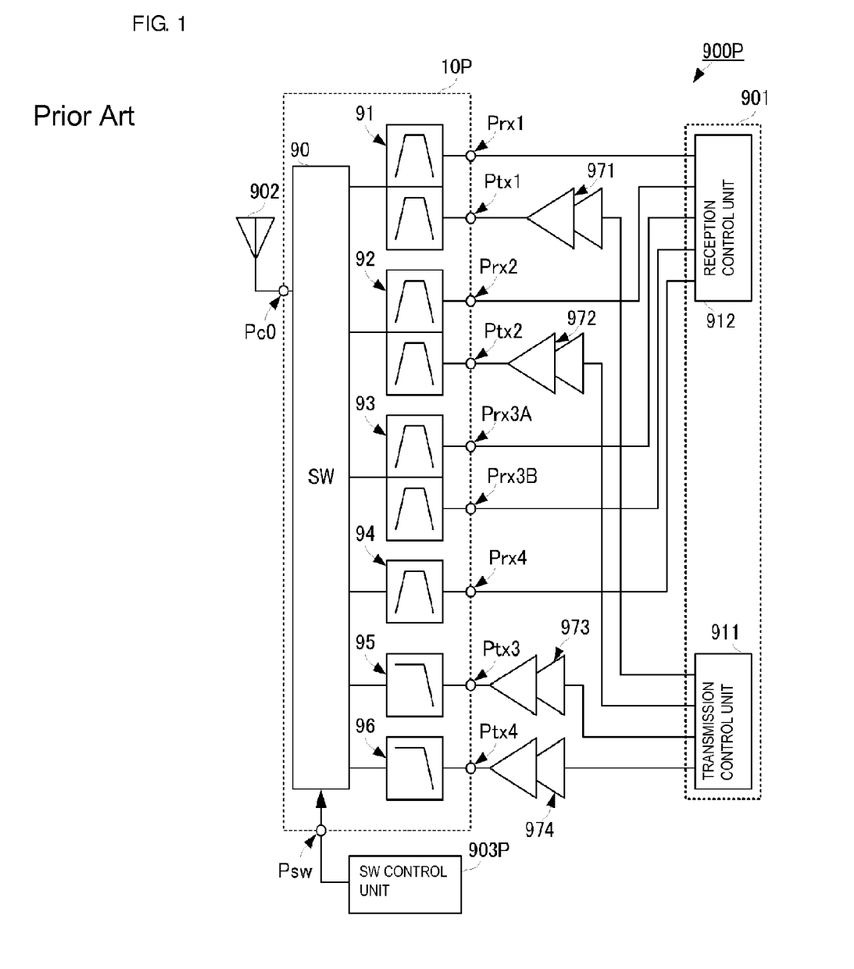
FIG. 1 is a circuit configuration diagram of a transmission/reception module 900P that includes an existing high frequency front end module 10P.

When such a common antenna is used, as illustrated in Japanese Unexamined Patent Application Publication No. 2010-528498 or in FIG. 1, typically, transmission/reception circuits for the respective communication signals are switched by a switching element and connected to the common antenna. FIG. 1 is a circuit configuration diagram of a transmission/reception module 900P that includes an existing high frequency front end module 10P.

The high frequency front end module 10P used in the existing transmission/reception module 900P includes a switch (SW) 90, SAW duplexers 91 and 92, a diplexer 93, a SAW filter 94, and low pass filters 95 and 96. The high frequency front end module 10P further includes an antenna side external connection terminal Pc0, transmission signal external input terminals Ptx1, Ptx2, Ptx3, and Ptx4, and reception signal external output terminals Prx1, Prx2, Prx3A, Prx3B, and Prx4.

The switch 90 is an SP6T (Single Pole 6 Throw) switch and includes a single common terminal and six individual terminals. The switch 90 connects the single common terminal to one of the six individual terminals in accordance with switch control that is performed by an SW control unit 903P via a control signal external input terminal Psw.

The common terminal of the switch 90 is connected to the antenna side external connection terminal Pc0. A first individual terminal is connected to the transmission signal external input terminal Ptx1 and the reception signal external output terminal Prx1 via the SAW duplexer 91. A second individual terminal is connected to the transmission signal external input terminal Ptx2 and the reception signal external output terminal Prx2 via the SAW duplexer 92. A third individual terminal is connected to the reception signal external output terminals Prx3A and Prx3B via the diplexer 93. A fourth individual terminal is connected to the reception signal external output terminal Prx4 via the SAW filter 94. A fifth individual terminal is connected to the transmission signal external input terminal Ptx3 via the low pass filter 95. A sixth individual terminal is connected to the transmission signal external input terminal Ptx4 via the low pass filter 96.

The transmission signal external input terminals Ptx1, Ptx2, Ptx3, and Ptx4 are connected to a transmission control unit 911 of a communication control unit 901 via respective power amplifiers 971, 972, 973, and 974. The reception signal external output terminals Prx1, Prx2, Prx3A, Prx3B, and Prx4 are connected to a reception control unit 912 of the communication control unit 901.

With this configuration, the high frequency front end module 10P illustrated in FIG. 1 transmits and receives transmission signals and reception signals that use different frequency bands via a single antenna 902.

With the existing high frequency front end module 10P illustrated in FIG. 1, however, the number of individual terminals in a switch increases along with an increase in the number of transmission signals and reception signals. A semiconductor switch formed by an FET or the like is typically used in such a high frequency front end module, and an increase in the number of individual terminals leads to an increase in the size of the switch, which in turn increases the cost to a great extent.

SUMMARY OF THE INVENTION

Accordingly, preferred embodiments of the present invention provide a high frequency front end module that is smaller than an existing one and that excels in transmission/reception characteristics, without using a switch having a large number of individual terminals (the number of switching connection terminals) as in the existing technique.

A high frequency front end module according to a preferred embodiment of the present invention is configured to, by using a common antenna configured for a plurality of types of communication signals, transmit a transmission signal of the plurality of communication signals and receive a reception signal of the plurality of communication signals. Such a high frequency front end module includes a circulator, a transmission side filter, and a reception side filter. The circulator includes an antenna side port to be connected to the common antenna, a reception side port configured to output the reception signal, and a transmission side port configured to accept input of the transmission signal. The circulator is configured to transmit the transmission signal from the transmission side port to the antenna side port and transmit the reception signal from the antenna side port to the reception side port. The transmission side filter is connected to the transmission side port of the circulator. The reception side filter is connected to the reception side port of the circulator.

With the configuration as described above, the circulator preferably further includes an adjustment circuit configured to adjust, in accordance with the communication signals, transmission characteristics from the transmission side port to the antenna side port, transmission characteristics from the antenna side port to the reception side port, and blocking characteristics from the transmission side port to the reception side port. The transmission side filter and the reception side filter each include a variable filter capable of adjusting a pass band and an attenuation band in accordance with the frequency bands of the communication signals.

Such a configuration makes it possible to adjust the pass characteristics between the transmission side and the antenna side and between the reception side and the antenna side and the blocking characteristics between the transmission and the reception on a communication signal by communication signal basis. This in turn makes it possible to transmit and receive the plurality of types of communication signals by using the single circulator. In addition, since the transmission side filter and the reception side filter can also be adjusted to have the pass characteristics and the attenuation characteristics in accordance with the communication signals, the high frequency front end module only needs to include a common transmission signal external input terminal configured for a plurality of transmission signals and a common reception signal external output terminal configured for a plurality of reception signals. Thus, the entire configuration of the high frequency front end module is greatly simplified and achieves a significant reduction in size. Since the characteristics of the circulator, the transmission side filter, and the reception side filter have been adjusted in accordance with the communication signals, their pass characteristics that correspond to each of the communication signals are retained.

An adjustment circuit of the high frequency front end module according to a preferred embodiment of the present invention is realized by the following configuration serving as an example. The adjustment circuit includes at least one of a first variable impedance circuit connected between the transmission side port and the antenna side port, a second variable impedance circuit connected between the antenna side port and the reception side port, and a third variable impedance circuit connected between the transmission side port and the reception side port.

This configuration indicates a specific example of the configuration of the adjustment circuit, and a variable impedance circuit is connected between two ports of the circulator. Here, it is preferable that a variable impedance circuit be connected at each location between the two ports.

Providing the variable impedance circuit in such a manner makes it possible to adjust impedance to the antenna side port as seen from the transmission side port, impedance to the reception side port as seen from the antenna side port, and impedance to the reception side port as seen from the transmission side port. As a result, the transmission signal is transmitted from the transmission side port to the antenna side port with low loss; the transmission signal is blocked so as not to be transmitted from the transmission side port to the reception side port; and the reception signal is transmitted from the antenna side port to the reception side port with low loss, on a communication signal by communication signal basis.

Furthermore, in a high frequency front end module according to a preferred embodiment of the present invention, it is preferable that the first variable impedance circuit, the second variable impedance circuit, and the third variable impedance circuit each be a variable capacitance circuit.

Such a configuration makes it possible to simplify the configuration of each variable impedance circuit and facilitate impedance adjustment.

In a high frequency front end module according to a preferred embodiment of the present invention, it is preferable that the variable capacitance circuit includes a switching element for a circulator and a plurality of fixed capacitance capacitors that are to be connected selectively by the switching element for a circulator.

Such a configuration makes it possible to form the variable capacitance circuit by general purpose capacitors and a general purpose switch with ease.

A variable filter of the high frequency front end module according to a preferred embodiment of the present invention can be realized by the following configuration serving as an example. The variable filter includes a plurality of SAW filters each having a pass band set for one of the frequency bands to be used by the plurality of types of communication signals and a switching element for a filter which is configured to selectively connect the plurality of SAW filters.

Such a configuration makes it possible to realize the pass characteristics and the attenuation characteristics in accordance with the communication signals with each and also to isolate a SAW filter that is not being used from a transmission system.

Alternatively, a variable filter of the high frequency front end module according to a preferred embodiment of the present invention can be realized by the following configuration serving as another example. The variable filter includes a plurality of SAW filters each having a pass band set for one of the frequency bands to be used by the plurality of types of communication signals and an impedance adjustment circuit configured to adjust impedance such that a communication signal to be transmitted is inputted or outputted only to or from a SAW filter that corresponds to that communication signal.

Such a configuration does not use a switch, and thus the variable filter has a simple structure. Accordingly, the high frequency front end module has a simple structure.

In a high frequency front end module according to a preferred embodiment of the present invention, it is preferable that the impedance adjustment circuit be connected to the plurality of SAW filters at a side of ports thereof that are connected to the circulator, and the switching element for a filter be connected to the plurality of SAW filters at a side opposite to the ports that are connected to the circulator.

With this configuration, the impedance adjustment circuit carries out impedance matching between each of the SAW filters and the circulator, and thus a matching circuit does not need to be provided separately. As a result, the high frequency front end module that is further reduced in size is realized.

In addition, it is preferable that an impedance adjustment circuit of the high frequency front end module according to a preferred embodiment of the present invention includes transmission lines that are connected to the plurality of SAW filters and that each have an electrical length thereof being adjusted.

Such a configuration makes it possible to simplify the impedance adjustment circuit. As a result, the configuration of the high frequency front end module is further simplified.

According to various preferred embodiments of the present invention, a small-sized high frequency front end module that excels in the transmission/reception characteristics is realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A high frequency front end module 10 according to a first preferred embodiment of the present invention will be described with reference to the drawings. In the first preferred embodiment, a transmission signal of a GSM (Global System for Mobile Communications) 850 communication signal (hereinafter, referred to as a GSM 850 transmission signal), a reception signal of the GSM 850 communication signal (hereinafter, referred to as a GSM 850 reception signal), a transmission signal of a GSM 900 communication signal (hereinafter, referred to as a GSM 900 transmission signal), and a reception signal of the GSM 900 communication signal (hereinafter, referred to as a GSM 900 reception signal) preferably are transmitted or received, for example. Note that although a configuration in which two kinds of communication signals, namely, the GSM 850 communication signal and the GSM 900 communication signal are transmitted or received via a common antenna 902 is described in the first preferred embodiment, the first preferred embodiment can also be applied to a case in which, of the GSM 850 communication signal, the GSM 900 communication signal, a GSM 1800 communication signal, a GSM 1900 communication signal, and a communication signal of each band in the W-CDMA (Wideband Code Division Multiple Access), a plurality of communication signals are transmitted or received via the common antenna 902. In other words, the first preferred embodiment can be applied to any configuration in which a plurality of types of communication signals that are set such that a transmission frequency band and a reception frequency band of each of the types of communication signals do not overlap are transmitted or received via a common antenna.

In the high frequency front end module 10 of the first preferred embodiment, each circuit configuration element to be described later preferably is defined by a multilayer body obtained by stacking dielectric layers on which electrode patterns are located and a chip type circuit element mounted on the multilayer body.

Figure 2:
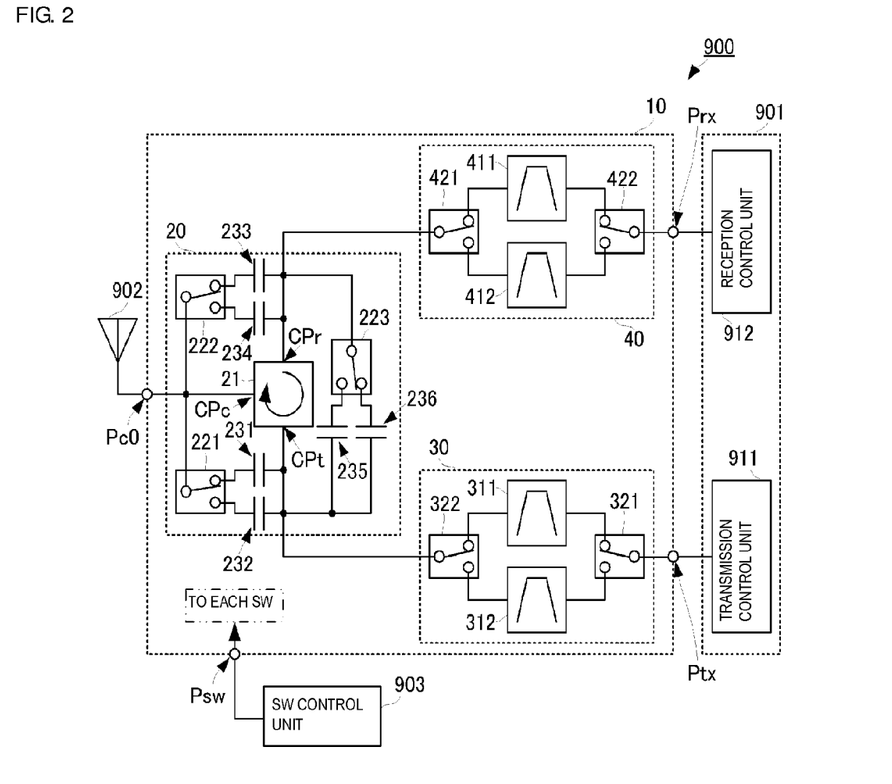
FIG. 2 is a circuit diagram of a transmission/reception module 900 that includes a high frequency front end module 10 according to a first preferred embodiment according to a present invention.

FIG. 2 is a circuit diagram of a transmission/reception module 900 that includes the high frequency front end module 10 according to the first preferred embodiment. The high frequency front end module 10 includes a variable circulator 20, a transmission side filter 30, and a reception side filter 40. The high frequency front end module 10 further includes an antenna side external connection terminal Pc0, a transmission signal external input terminal Ptx, a reception signal external output terminal Prx, and a control signal external input terminal Psw.

The high frequency front end module 10 roughly includes the following configuration as an internal connection configuration. An antenna side port of the variable circulator 20 (an antenna side port CPc of a circulator 21, which will be described later) is connected to the antenna side external connection terminal Pc0. The transmission side filter 30 is connected to a transmission side port of the variable circulator 20 (a transmission side port CPt of the circulator 21, which will be described later). The transmission signal external input terminal Ptx is connected to the transmission side filter 30. The reception side filter 40 is connected to a reception side port of the variable circulator 20 (a reception side port CPr of the circulator 21, which will be described later). The reception signal external output terminal Prx is connected to the reception side filter 40.

The high frequency front end module 10 includes the following configuration as an external connection configuration. A transmission control unit 911 of a communication control unit 901 is connected to the transmission signal external input terminal Ptx. A reception control unit 912 of the communication control unit 901 is connected to the reception signal external output terminal Prx. An antenna 902 is connected to the antenna side external connection terminal Pc0. A switch control unit 903 is connected to a control signal external input terminal Psw.

Figure 3A:
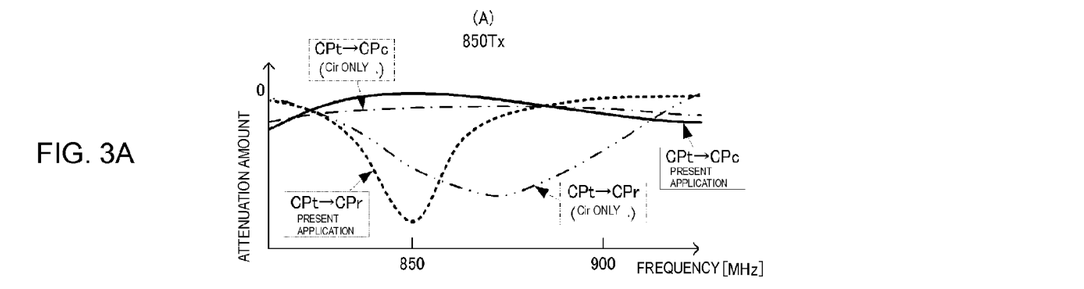
FIGS. 3A-3D illustrate frequency characteristics of attenuation for describing the concepts of transmission characteristics and blocking characteristics of a variable circulator 20.
Figure 3B:
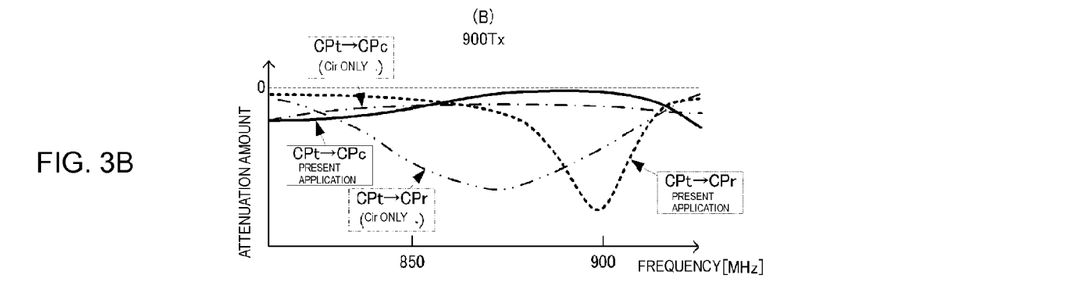
Figure 3C:
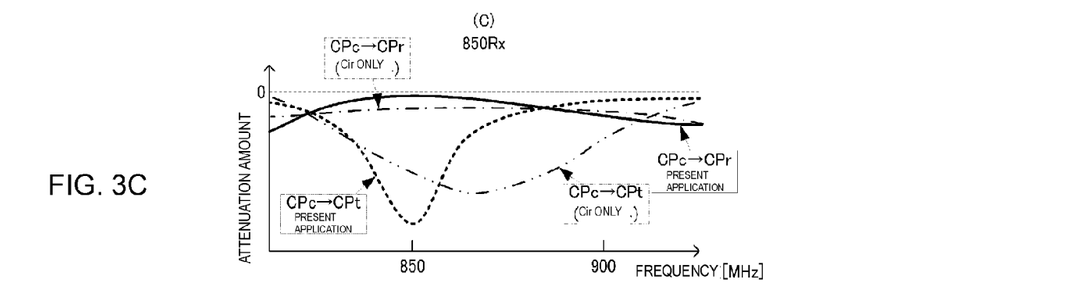
Figure 3D:
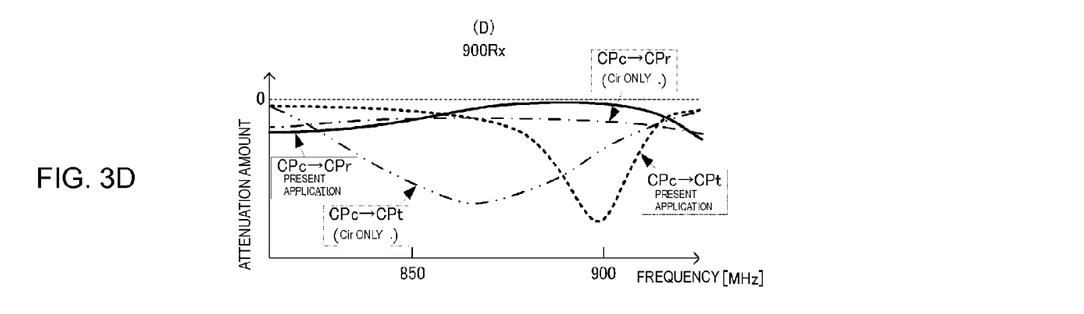

The configuration of the variable circulator 20 will now be described in detail. FIG. 3 illustrates frequency characteristics of attenuation for describing the concepts of transmission characteristics and blocking characteristics of the variable circulator 20. FIG. 3A illustrates the characteristics against the GSM 850 transmission signal; FIG. 3B illustrates the characteristics against the GSM 900 transmission signal; FIG. 3C illustrates the characteristics against the GSM 850 reception signal; and FIG. 3D illustrates the characteristics against the GSM 900 reception signal. It should be noted that "Cir only" in FIG. 3 indicates a case in which only the circulator 21 is used without using the configuration of the present application.

The variable circulator 20 includes the circulator 21, switches 221, 222, and 223, and capacitors 231, 232, 233, 234, 235, and 236.

The circulator 21 includes the antenna side port CPc, the transmission side port CPt, and the reception side port CPr.

A common terminal of the switch 221 is connected to the antenna side port CPc. The switch 221 connects the common terminal to one of the two individual terminals thereof in accordance with a switch control signal from the switch control unit 903. One of the individual terminals of the switch 221 is connected to the transmission side port CPt via the capacitor 231. The other individual terminal of the switch 221 is connected to the transmission side port CPt via the capacitor 232. Capacitance $C_{231}$ of the capacitor 231 differs from capacitance $C_{232}$ of the capacitor 232. Such a circuit including the switch 221 and the capacitors 231 and 232 corresponds to an "adjustment circuit". Such a configuration makes it possible to selectively connect one of the capacitors 231 and 232, which differ in capacitance, between the antenna side port CPc and the transmission side port CPt in accordance with the switch control signal.

A common terminal of the switch 222 is connected to the antenna side port CPc. The switch 222 connects the common terminal to one of the two individual terminals thereof in accordance with a switch control signal from the switch control unit 903. One of the individual terminals of the switch 222 is connected to the reception side port CPr via the capacitor 233. Meanwhile, the other individual terminal of the switch 222 is connected to the reception side port CPr via the capacitor 234. Capacitance $C_{233}$ of the capacitor 233 differs from capacitance $C_{234}$ of the capacitor 234. Such a circuit including the switch 222 and the capacitors 233 and 234 also corresponds to the "adjustment circuit". Such a configuration makes it possible to selectively connect one of the capacitors 233 and 234, which differ in capacitance, between the antenna side port CPc and the reception side port CPr in accordance with the switch control signal.

A common terminal of the switch 223 is connected to the reception side port CPr. The switch 223 connects the common terminal to one of the two individual terminals thereof in accordance with a switch control signal from the switch control unit 903. One of the individual terminals of the switch 223 is connected to the transmission side port CPt via the capacitor 235. The other individual terminal of the switch 223 is connected to the transmission side port CPt via the capacitor 236. Capacitance $C_{235}$ of the capacitor 235 differs from capacitance $C_{236}$ of the capacitor 236. Such a circuit including the switch 223 and the capacitors 235 and 236 also corresponds to the "adjustment circuit". Such a configuration makes it possible to selectively connect one of the capacitors 235 and 236, which differ in capacitance, between the transmission side port CPt and the reception side port CPr in accordance with the switch control signal.

The circulator 21, which is based on a known circulator structure, transmits a transmission signal inputted via the transmission side port CPt to the antenna side port CPc and outputs the transmission signal. In addition, the circulator transmits a reception signal inputted via the antenna side port CPc to the reception side port CPr and outputs the reception signal. Furthermore, the circulator 21 blocks a transmission signal inputted from the transmission side port CPt so as not to be transmitted to the reception side port CPr.

The structure of the circulator 21 alone, however, can achieve only a single type of transmission characteristics and blocking characteristics. Therefore, the circulator 21 of the first preferred embodiment is configured such that the frequency bands of the GSM 850 transmission signal and of the GSM 900 transmission signal serve as pass bands in a transmission path connecting the transmission side port CPt and the antenna side port CPc, as indicated by dashed dotted lines in FIGS. 3A and 3B, in order to transmit both the GSM 850 transmission signal and the GSM 900 transmission signal from the transmission side port CPt to the antenna side port CPc. This configuration, however, causes insertion losses to occur to some extent in the GSM 850 transmission signal and the GSM 900 transmission signal, as indicated by the dashed dotted lines in FIGS. 3A and 3B.

In addition, the circulator 21 of the first preferred embodiment is configured such that the frequency bands of the GSM 850 transmission signal and of the GSM 900 transmission signal serve as attenuation bands in a transmission path connecting the transmission side port CPt and the reception side port CPr, as indicated by dashed double-dotted lines in FIGS. 3A and 3B, in order to block both the GSM 850 transmission signal and the GSM 900 transmission signal so as not to be transmitted from the transmission side port CPt to the reception side port CPr. This configuration, however, does not allow sufficient attenuation of the GSM 850 transmission signal and the GSM 900 transmission signal to be obtained, as indicated by the dashed double-dotted lines in FIGS. 3A and 3B.

Similarly, the circulator 21 of the first preferred embodiment is configured such that the frequency bands of the GSM 850 reception signal and of the GSM 900 reception signal serve as pass bands in a transmission path connecting the antenna side port CPc and the reception side port CPr, as indicated by dashed dotted lines in FIGS. 3C and 3D, in order to transmit both the GSM 850 reception signal and the GSM 900 reception signal from the antenna side port CPc to the reception side port CPr. This configuration, however, causes insertion losses to occur to some extent in the GSM 850 reception signal and the GSM 900 reception signal, as indicated by the dashed dotted lines in FIGS. 3C and 3D.

Furthermore, the circulator 21 of the first preferred embodiment is configured such that the frequency bands of the GSM 850 reception signal and of the GSM 900 reception signal serve as attenuation bands in a transmission path connecting the antenna side port CPc and the transmission side port CPt, as indicated by dashed double-dotted lines in FIGS. 3C and 3D, in order to block both the GSM 850 reception signal and the GSM 900 reception signal so as not to be transmitted from the antenna side port CPc to the transmission side port CPt. This configuration, however, does not allow sufficient attenuation of the GSM 850 reception signal and the GSM 900 reception signal to be obtained, as indicated by the dashed double-dotted lines in FIGS. 3C and 3B.

Therefore, as in the first preferred embodiment, by controlling the switches 221, 222, and 223 so as to switch and connect the capacitors each having predetermined capacitance at respective locations between two of the antenna side port CPc, the transmission side port CPt, and the reception side port CPr of the circulator 21.

Specifically, for example, when transmitting the GSM 850 transmission signal and when receiving the GSM 850 reception signal, the capacitor 231 having the capacitance $C_{231}$ becomes connected between the antenna side port CPc and the transmission side port CPt. In addition, the capacitor 233 having the capacitance $C_{233}$ becomes connected between the antenna side port CPc and the reception side port CPr. Furthermore, the capacitor 235 having the capacitance $C_{235}$ becomes connected between the transmission side port CPt and the reception side port CPr.

The capacitances $C_{231}$, $C_{233}$, and $C_{235}$ of the respective capacitors 231, 233, and 235 are set so as to allow the following characteristics to be obtained.

The phase of the GSM 850 transmission signal is rotated such that impedance to the antenna side port CPc as seen from the transmission side port CPt and impedance to the reception side port CPr as seen from the antenna side port CPc each become approximately 50Ω, for example. At the same time, the phase is rotated such that impedance to the reception side port CPr as seen from the transmission side port CPt and impedance to the transmission side port CPt as seen from the antenna side port CPc each approach infinity.

Connecting such capacitors 231, 233, and 235 having the capacitances $C_{231}$, $C_{233}$, and $C_{235}$, respectively, makes it possible to reduce an insertion loss of a signal transmitted from the transmission side port CPt to the antenna side port CPc in the frequency band of the GSM 850 transmission signal, as indicated by a solid line in FIG. 3A, leading to an improvement. At the same time, as indicated by a broken line in FIG. 3A, attenuation of a signal transmitted from the transmission side port CPt to the reception side port CPr is increased in the frequency band of the GSM 850 transmission signal.

As a result, when transmitting the GSM 850 transmission signal, the variable circulator 20 transmits the GSM 850 transmission signal from the transmission side port CPt to the antenna side port CPc with low loss. In addition, the variable circulator 20 sufficiently suppresses or prevents sneaking of the GSM 850 transmission signal from the transmission side port CPt to the reception side port CPr and ensures isolation between the transmission and the reception to a sufficient degree.

Furthermore, connecting the capacitors 231, 233, and 235 having the capacitances $C_{231}$, $C_{233}$, and $C_{235}$, respectively, makes it possible to reduce an insertion loss of a signal transmitted from the antenna side port CPc to the reception side port CPr in the frequency band of the GSM 850 reception signal, as indicated by a solid line in FIG. 3C, leading to an improvement. At the same time, as indicated by a broken line in FIG. 3C, attenuation of a signal transmitted from the antenna side port CPc to the transmission side port CPt is increased in the frequency band of the GSM 850 reception signal.

On the contrary to the case of the GSM 850, for example, when transmitting the GSM 900 transmission signal and when receiving the GSM 900 reception signal, the capacitor 232 having the capacitance $C_{232}$ becomes connected between the antenna side port CPc and the transmission side port CPt. In addition, the capacitor 234 having the capacitance $C_{234}$ becomes connected between the antenna side port CPc and the reception side port CPr. Furthermore, the capacitor 236 having the capacitance $C_{236}$ becomes connected between the transmission side port CPt and the reception side port CPr.

The capacitances $C_{232}$, $C_{234}$, and $C_{236}$ of the respective capacitors 232, 234, and 236 are set so as to allow the following characteristics to be obtained.

The phase of the GSM 900 transmission signal is rotated such that impedance to the antenna side port CPc as seen from the transmission side port CPt and impedance to the reception side port CPr as seen from the antenna side port CPc each become approximately 50Ω, for example. At the same time, the phase is rotated such that impedance to the reception side port CPr as seen from the transmission side port CPt and impedance to the transmission side port CPt as seen from the antenna side port CPc each approach infinity.

Connecting such capacitors 232, 234, and 236 having the capacitances $C_{232}$, $C_{234}$, and $C_{236}$, respectively, makes it possible to reduce an insertion loss of a signal transmitted from the transmission side port CPt to the antenna side port CPc in the frequency band of the GSM 900 transmission signal, as indicated by a solid line in FIG. 3B, leading to an improvement. At the same time, as indicated by a broken line in FIG. 3B, attenuation of a signal transmitted from the transmission side port CPt to the reception side port CPr is increased in the frequency band of the GSM 900 transmission signal.

As a result, when transmitting the GSM 900 transmission signal, the variable circulator 20 transmits the GSM 900 transmission signal from the transmission side port CPt to the antenna side port CPc with low loss. In addition, the variable circulator 20 sufficiently suppresses or prevents sneaking of the GSM 900 transmission signal from the transmission side port CPt to the reception side port CPr and ensure isolation between the transmission and the reception to a sufficient degree.

Furthermore, connecting the capacitors 232, 234, and 236 having the capacitances $C_{232}$, $C_{234}$, and $C_{236}$, respectively, makes it possible to reduce an insertion loss of a signal transmitted from the antenna side port CPc to the reception side port CPr in the frequency band of the GSM 900 reception signal, as indicated by a solid line in FIG. 3D, leading to an improvement. At the same time, as indicated by a broken like in FIG. 3D, attenuation of a signal transmitted from the antenna side port CPc to the transmission side port CPt is increased in the frequency band of the GSM 900 reception signal.

As described thus far, the use of the variable circulator of the first preferred embodiment makes it possible to transmit and receive, with low loss, a plurality of transmission signals and reception signals having different frequency bands and to ensure isolation between the transmission circuit and the reception circuit for each of the communication signals.

The configuration of the transmission side filter 30 will now be described in detail. As illustrated in FIG. 2, the transmission side filter 30 includes SAW filters 311 and 312 and switches 321 and 322.

The SAW filter 311 preferably has a pass band in the frequency band of the GSM 850 transmission signal and an attenuation region in other frequency bands. The SAW filter 312 preferably has a pass band in the frequency band of the GSM 900 transmission signal and an attenuation region in other frequency bands.

A common terminal of the switch 321 is connected to the transmission signal external input terminal Ptx of the high frequency front end module 10. The switch 321 connects the common terminal to one of the two individual terminals thereof in accordance with a switch control signal from the switch control unit 903. One of the individual terminals of the switch 321 is connected to the SAW filter 311, and the other individual terminal of the switch 321 is connected to the SAW filter 312.

A common terminal of the switch 322 is connected to the transmission side port CPt of the circulator 21. The switch 322 connects the common terminal to one of the two individual terminals thereof in accordance with a switch control signal from the switch control unit 903. One of the individual terminals of the switch 322 is connected to the SAW filter 311, and the other individual terminal of the switch 322 is connected to the SAW filter 312.

With the configuration as described above, when transmitting the GSM 850 transmission signal, the switches 321 and 322 are controlled such that the signal is transmitted to the SAW filter 311. Meanwhile, when transmitting the GSM 900 transmission signal, the switches 321 and 322 are controlled such that the signal is transmitted to the SAW filter 312. As a result, when transmitting the GSM 850 transmission signal, the transmission side filter 30 suppresses or prevents noise such as a harmonic signal which is inputted along with the GSM 850 transmission signal and outputs the GSM 850 transmission signal to the circulator 21 of the variable circulator 20. Furthermore, when transmitting the GSM 900 transmission signal, the transmission side filter 30 suppresses or prevents noise such as a harmonic signal which is inputted along with the GSM 900 transmission signal and outputs the GSM 900 transmission signal to the circulator 21 of the variable circulator 20.

The configuration of the reception side filter 40 will now be described in detail. As illustrated in FIG. 2, the reception side filter 40 includes SAW filters 411 and 412 and switches 421 and 422.

The SAW filter 411 preferably has a pass band in the frequency band of the GSM 850 reception signal and has an attenuation region in other frequency bands. The SAW filter 412 preferably has a pass band in the frequency band of the GSM 900 reception signal and has an attenuation region in other frequency bands.

A common terminal of the switch 421 is connected to the reception side port CPr of the circulator 21. The switch 421 connects the common terminal to one of the two individual terminals thereof in accordance with a switch control signal from the switch control unit 903. One of the individual terminals of the switch 421 is connected to the SAW filter 411, and the other individual terminal of the switch 421 is connected to the SAW filter 412.

A common terminal of the switch 422 is connected to the reception signal external output terminal Prx of the high frequency front end module 10. The switch 422 connects the common terminal to one of the two individual terminals thereof in accordance with a switch control signal from the switch control unit 903. One of the individual terminals of the switch 422 is connected to the SAW filter 411, and the other individual terminal of the switch 422 is connected to the SAW filter 412.

With the configuration as described above, when receiving the GSM 850 reception signal, the switches 421 and 422 are controlled such that the signal is transmitted to the SAW filter 411. Meanwhile, when receiving the GSM 900 reception signal, the switches 421 and 422 are controlled such that the signal is transmitted to the SAW filter 412. As a result, when receiving the GSM 850 reception signal, the reception side filter 40 suppresses or prevents noise containing frequency components other than that of the GSM 850 reception signal and outputs the GSM 850 reception signal to the reception signal external output terminal Prx. Meanwhile, when receiving the GSM 900 reception signal, the reception side filter 40 suppresses or prevents noise containing frequency components other than that of the GSM 900 reception signal and outputs the GSM 900 reception signal to the reception signal external output terminal Prx.

Even with a configuration in which a plurality of transmission signals are inputted via the common transmission signal external input terminal Ptx and a plurality of reception signals are outputted via the common reception signal external output terminal Prx, the configuration of the reception side filter 40 as described above achieves, along with the advantageous effect of the variable circulator 20 described above, synergy as follows. That is to say, isolation between the transmission signal external input terminal Ptx and the reception signal external output terminal Prx, or in other words, isolation between the transmission control unit 911 and the reception control unit 912 of the communication control unit 901 is ensured at a very high level for each of the transmission signals and the reception signals.

In the case where the characteristics of the first preferred embodiment are to be realized by using an existing SPnT switch, individual terminals designed, respectively, to transmit the GSM 850, receive the GSM 850, transmit the GSM 900, and receive the GSM 900 are required, leading to an SP0T switch. The configuration of the first preferred embodiment, however, does not require such a multiple branching type switch, facilitating further reduction in size. Since the size of an SPnT type switch increases along with an increase in the number of communication signals to be transmitted or received, the superiority of the configuration of the first preferred embodiment becomes more evident. In other words, a high frequency front end module that has been further reduced in size while maintaining sufficient transmission characteristics is realized.

Figure 4:
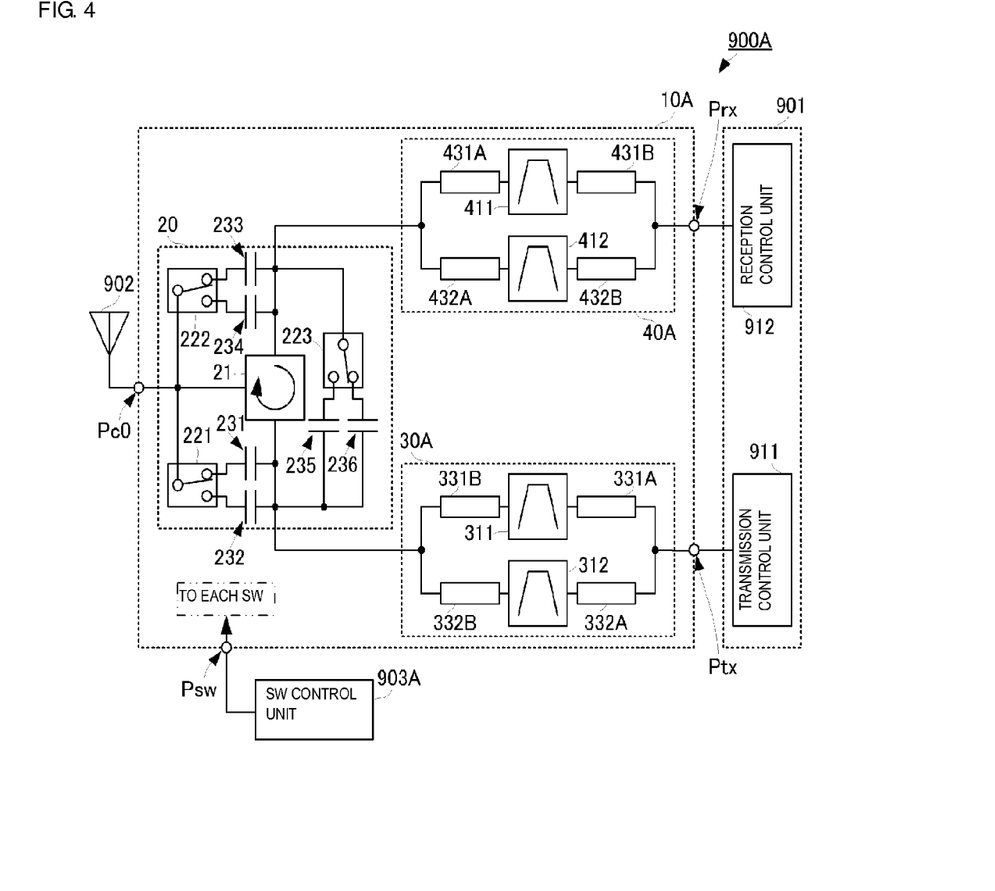
FIG. 4 is a circuit diagram of a transmission/reception module 900A that includes a high frequency front end module 10A according to a second preferred embodiment according to a present invention.

A high frequency front end module according to a second preferred embodiment of the present invention will now be described with reference to the drawings. FIG. 4 is a circuit diagram of a transmission/reception module 900A that includes a high frequency front end module 10A according to the second preferred embodiment. The high frequency front end module 10A of the second preferred embodiment preferably has a configuration similar to that of the high frequency front end module 10 described in the first preferred embodiment with an exception of the internal configurations of a transmission side filter 30A and a reception side filter 40A. Thus, only the parts that differ from those of the first preferred embodiment will be described.

The transmission side filter 30A includes the SAW filters 311 and 312. These SAW filters 311 and 312 are preferably the same as those in the first preferred embodiment.

One end of the SAW filter 311 is connected to the transmission signal external input terminal Ptx via a phase adjustment line 331A. The other end of the SAW filter 311 is connected to the transmission side port CPt of the circulator 21 via a phase adjustment line 331B. One or both of the phase adjustment lines 331A and 331B has/have an electrical length that rotates a phase in such a manner that impedance to the SAW filter 311 as seen from the transmission signal external input terminal Ptx approaches infinity in the frequency band of the GSM 900 transmission signal.

One end of the SAW filter 312 is connected to the transmission signal external input terminal Ptx via a phase adjustment line 332A. The other end of the SAW filter 312 is connected to the transmission side port CPt of the circulator 21 via a phase adjustment line 332B. One or both of the phase adjustment lines 332A and 332B has/have an electrical length that rotates a phase in such a manner that impedance to the SAW filter 312 as seen from the transmission signal external input terminal Ptx approaches infinity in the frequency band of the GSM 850 transmission signal.

With the configuration described above, the GSM 850 transmission signal is transmitted to the circulator 21 via the SAW filter 311. At this time, the phase adjustment line 331A also functions as a matching circuit for the GSM 850 transmission signal between the transmission signal external input terminal Ptx and the SAW filter 311. In addition, the phase adjustment line 331B also functions as a matching circuit for the GSM 850 transmission signal between the SAW filter 311 and the circulator 21. As a result, when transmitting the GSM 850 transmission signal, the GSM 850 transmission signal is transmitted from the transmission signal external input terminal Ptx to the circulator 21 with low loss.

Meanwhile, the GSM 900 transmission signal is transmitted to the circulator 21 via the SAW filter 312. At this time, the phase adjustment line 332A also functions as a matching circuit for the GSM 900 transmission signal between the transmission signal external input terminal Ptx and the SAW filter 312. In addition, the phase adjustment line 332B also functions as a matching circuit for the GSM 900 transmission signal between the SAW filter 312 and the circulator 21. As a result, when transmitting the GSM 900 transmission signal, the GSM 900 transmission signal is transmitted from the transmission signal external input terminal Ptx to the circulator 21 with low loss.

The reception side filter 40A includes the SAW filters 411 and 412. These SAW filters 411 and 412 are preferably the same as those in the first preferred embodiment.

One end of the SAW filter 411 is connected to the reception side port CPr of the circulator 21 via a phase adjustment line 431A. The other end of the SAW filter 411 is connected to the reception signal external output terminal Prx via a phase adjustment line 431B. One or both of the phase adjustment lines 431A and 431B has/have an electrical length that rotates a phase in such a manner that impedance to the SAW filter 411 as seen from the reception side port CPr of the circulator 21 approaches infinity in the frequency band of the GSM 900 reception signal.

One end of the SAW filter 412 is connected to the reception side port CPr of the circulator 21 via a phase adjustment line 432A. The other end of the SAW filter 412 is connected to the reception signal external output terminal Prx via a phase adjustment line 432B. One or both of the phase adjustment lines 432A and 432B has/have an electrical length that rotates a phase in such a manner that impedance to the SAW filter 412 as seen from the reception side port CPr of the circulator 21 approaches infinity in the frequency band of the GSM 850 reception signal.

With the configuration described above, the GSM 850 reception signal is transmitted to the reception signal external output terminal Prx via the SAW filter 411. At this time, the phase adjustment line 431A also functions as a matching circuit for the GSM 850 reception signal between the circulator 21 and the SAW filter 411. In addition, the phase adjustment line 431B also functions as a matching circuit for the GSM 850 reception signal between the SAW filter 411 and the reception signal external output terminal Prx. As a result, when receiving the GSM 850 reception signal, the GSM 850 reception signal is transmitted from the circulator 21 to the reception signal external output terminal Prx with low loss.

Meanwhile, the GSM 900 reception signal is transmitted to the reception signal external output terminal Prx via the SAW filter 412. At this time, the phase adjustment line 432A also functions as a matching circuit for the GSM 900 reception signal between the circulator 21 and the SAW filter 412. In addition, the phase adjustment line 432B also functions as a matching circuit for the GSM 900 reception signal between the SAW filter 412 and the reception signal external output terminal Prx. As a result, when receiving the GSM 900 reception signal, the GSM 900 reception signal is transmitted from the circulator 21 to the reception signal external output terminal Prx with low loss.

With the configuration described above as well, advantageous effects similar to those of the first preferred embodiment can be obtained. Furthermore, the configuration of the second preferred embodiment does not use switches for the transmission side filter 30A and the reception side filter 40A, and thus the configuration of the high frequency front end module 10A is further simplified. In addition, the phase adjustment lines also function as the matching circuits, and thus a circuit element that performs matching does not need to be provided separately, which can even simplify the configuration. Additionally, a switch control unit 903A only carries out switch control of the variable circulator 20, and thus the control is also simplified.

Figure 5:
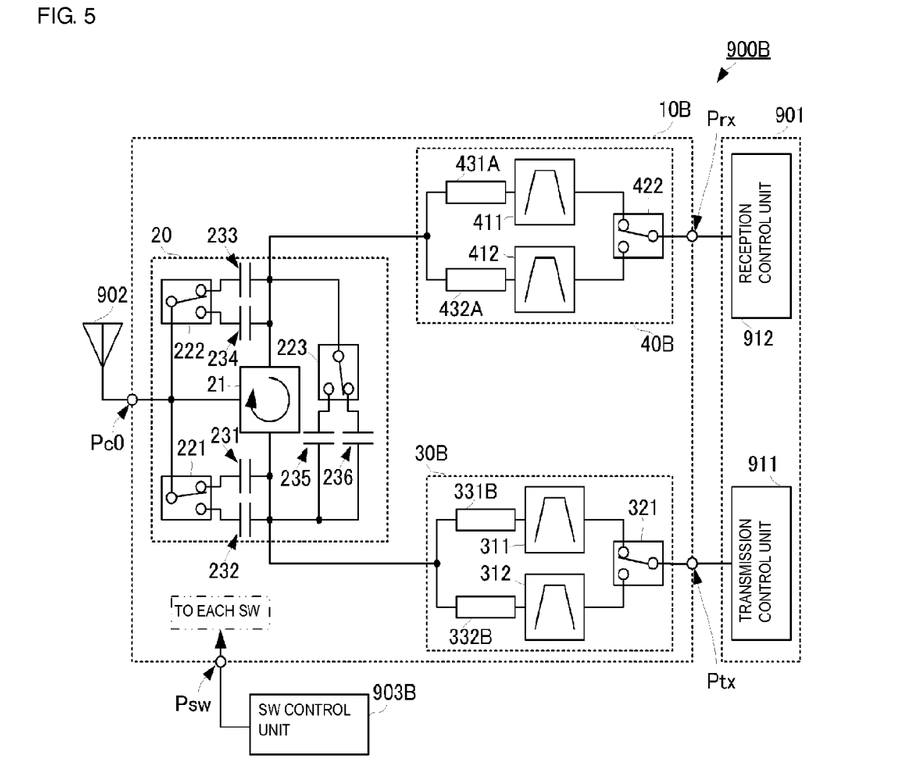
FIG. 5 is a circuit diagram of a transmission/reception module 900B that includes a high frequency front end module 10B according to a third preferred embodiment according to a present invention.

A high frequency front end module according to a third preferred embodiment of the present invention will now be described with reference to the drawings. FIG. 5 is a circuit diagram of a transmission/reception module 900B that includes a high frequency front end module 10B according to the third preferred embodiment. The high frequency front end module 10B of the third preferred embodiment has a configuration similar to that of the high frequency front end module 10 or 10A described in the first or second preferred embodiment with an exception of the internal configurations of a transmission side filter 30B and a reception side filter 40B. Thus, only the parts that differ from those of the first or second preferred embodiment will be described.

The transmission side filter 30B includes the SAW filters 311 and 312. These SAW filters 311 and 312 are preferably the same as those in the first preferred embodiment.

One end of the SAW filter 311 is connected to the transmission signal external input terminal Ptx via the switch 321, as in the first preferred embodiment. The other end of the SAW filter 311 is connected to the transmission side port CPt of the circulator 21 via the phase adjustment line 331B, as in the second preferred embodiment. One end of the SAW filter 312 is connected to the transmission signal external input terminal Ptx via the switch 321, as in the first preferred embodiment. The other end of the SAW filter 312 is connected to the transmission side port CPt of the circulator 21 via the phase adjustment line 332B, as in the second preferred embodiment.

With the configuration described above as well, as a switch control unit 903B carries out the switch control similar to that of the first preferred embodiment, the GSM 850 transmission signal is transmitted to the circulator 21 via the SAW filter 311, and the GSM 900 transmission signal is transmitted to the circulator 21 via the SAW filter 312. At this time, the phase adjustment lines 331B and 332B function as matching circuits, respectively, between the SAW filter 311 and the circulator 21 and between the SAW filter 312 and the circulator 21. As a result, transmission losses in the GSM 850 transmission signal and the GSM 900 transmission signal are reduced.

The reception side filter 40B includes the SAW filters 411 and 412. These SAW filters 411 and 412 are preferably the same as those in the first preferred embodiment.

One end of the SAW filter 411 is connected to the transmission side port CPt of the circulator 21 via the phase adjustment line 431A, as in the second preferred embodiment. The other end of the SAW filter 411 is connected to the reception signal external output terminal Prx via the switch 422, as in the first preferred embodiment. One end of the SAW filter 412 is connected to the transmission side port CPt of the circulator 21 via the phase adjustment line 432A, as in the second preferred embodiment. The other end of the SAW filter 412 is connected to the reception signal external output terminal Prx via the switch 422, as in the first preferred embodiment.

With the configuration described above as well, as the switch control unit 903B carries out the switch control similar to that of the first preferred embodiment, the GSM 850 reception signal is transmitted to the reception signal external output terminal Prx from the circulator 21 via the SAW filter 411, and the GSM 900 reception signal is transmitted to the reception signal external output terminal Prx from the circulator 21 via the SAW filter 412. At this time, the phase adjustment lines 431A and 432A function as matching circuits, respectively, between the circulator 21 and the SAW filter 411 and between the circulator 21 and the SAW filter 412. As a result, transmission losses of the GSM 850 reception signal and the GSM 900 reception signal are reduced.

With the configuration described above as well, advantageous effects similar to those of the first preferred embodiment are obtained. Furthermore, the configuration of the third preferred embodiment reduces the number of switches by half for the transmission side filter 30B and the reception side filter 40B, and thus the configuration of the high frequency front end module 10B is simplified. In addition, the phase adjustment lines also function as the matching circuits, and thus a circuit element that performs matching does not need to be provided separately, which even further simplify the configuration. Additionally, the control of the switch control unit 903B is even more simplified compared to that of the switch control unit 903 of the first preferred embodiment.

Figure 6:
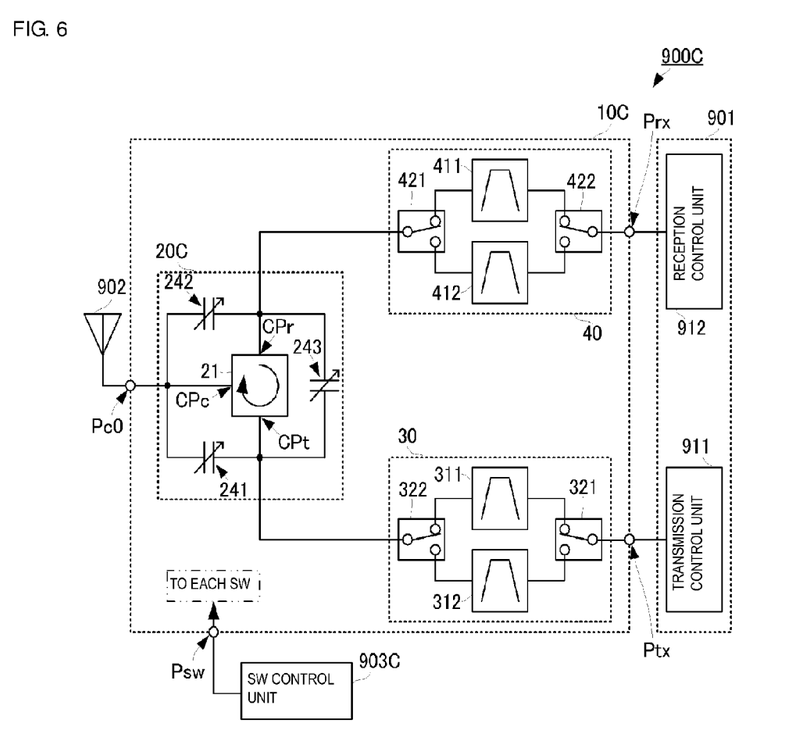
FIG. 6 is a circuit diagram of a transmission/reception module 900C that includes a high frequency front end module 10C according to a fourth preferred embodiment according to a present invention.

A high frequency front end module according to a fourth preferred embodiment of the present invention will now be described with reference to the drawings. FIG. 6 is a circuit diagram of a transmission/reception module 900C that includes a high frequency front end module 10C according to the fourth preferred embodiment. The high frequency front end module 10C of the fourth preferred embodiment has a configuration similar to that of the high frequency front end module 10 described in the first preferred embodiment with an exception of the internal configuration of a variable circulator 20C. Thus, only the parts that differ from those of the first preferred embodiment will be described.

The variable circulator 20C includes the circulator 21 and variable capacitance elements 241, 242, and 243. The circulator 21 is preferably the same as that described in the first preferred embodiment. The variable capacitance element 241 is connected between the antenna side port CPc and the transmission side port CPt of the circulator 21. The variable capacitance element 242 is connected between the antenna side port CPc and the reception side port CPr. The variable capacitance element 243 is connected between the transmission side port CPt and the reception side port CPr. These variable capacitance elements 241, 242, and 243 correspond to an "adjustment circuit."

Capacitances of the variable capacitance elements 241, 242, and 243 are controlled in accordance with the signals to be transmitted. The variable capacitance elements 241, 242, and 243 are each defined by, for example, a MEMS (Micro Electro Mechanical Systems) element, a variable capacitance diode, or the like, of which electrostatic capacitance is adjusted through an applied voltage.

With the configuration described above as well, advantageous effects similar to those of the first preferred embodiment are obtained. Furthermore, the configuration of the fourth preferred embodiment makes it possible to finely adjust the capacitance of the capacitor connected between the ports of the circulator 21, and thus impedance can be adjusted more finely against each of the GSM 850 communication signals (transmission signal and reception signal) and the GSM 900 communication signals (transmission signal and reception signal). As a result, a transmission loss is further suppressed or prevented.

Figure 7:
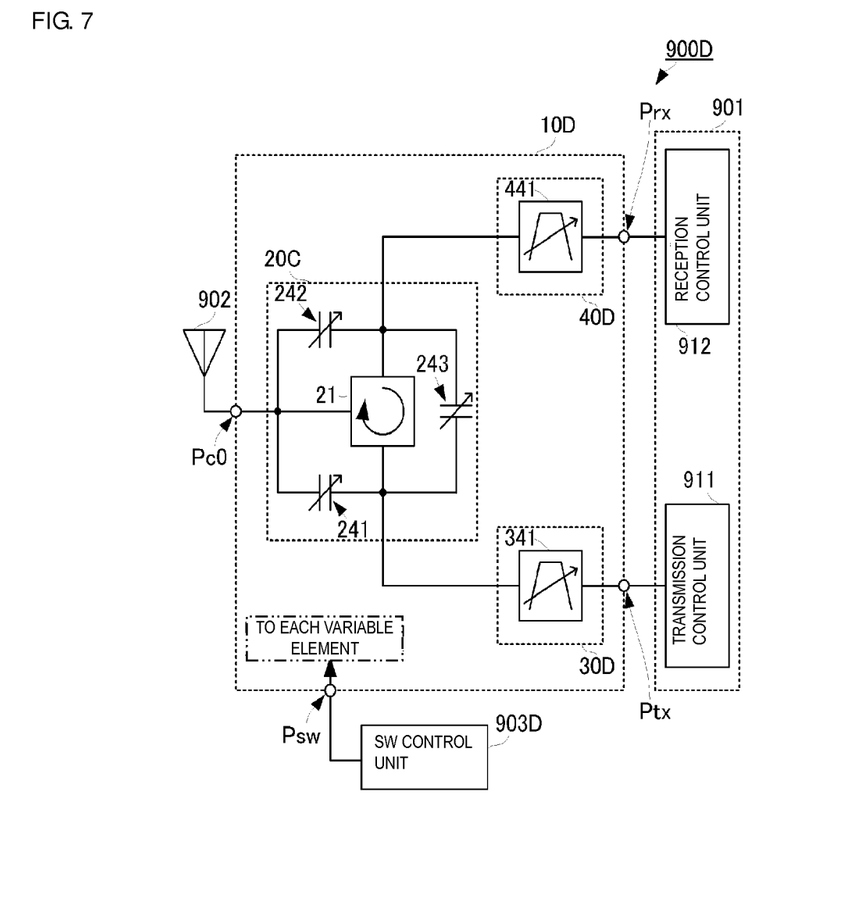
FIG. 7 is a circuit diagram of a transmission/reception module 900D that includes a high frequency front end module 10D according to a fifth preferred embodiment according to a present invention.

A high frequency front end module according to a fifth preferred embodiment of the present invention will now be described with reference to the drawings. FIG. 7 is a circuit diagram of a transmission/reception module 900D that includes a high frequency front end module 10D according to the fifth preferred embodiment. The high frequency front end module 10D of the fifth preferred embodiment has a configuration similar to that of the high frequency front end module 10C described in the fourth preferred embodiment with an exception of the internal configurations of transmission side filters 30D and the reception side filter 40D. Thus, only the parts that differ from those of the fourth preferred embodiment will be described.

The transmission side filter 30D preferably is a variable filter 341, of which a pass band and an attenuation band are adjusted through a control signal. The variable filter 341 has an adjustable structure that sets the frequency band of the GSM 850 transmission signal as the pass band and sets the other frequency bands as the attenuation region when transmitting the GSM 850 transmission signal. The variable filter 341 has an adjustable structure that sets the frequency band of the GSM 900 transmission signal as the pass band and sets the other frequency bands as the attenuation region when transmitting the GSM 900 transmission signal.

The reception side filter 40D preferably is a variable filter 441, of which a transmission frequency band and an attenuation band are adjusted through a control signal. The variable filter 441 has an adjustable structure that sets the frequency band of the GSM 850 reception signal as the pass band and sets the other frequency bands as the attenuation region when receiving the GSM 850 reception signal. The variable filter 441 has an adjustable structure that sets the frequency band of the GSM 900 reception signal as the pass band and sets the other frequency bands as the attenuation region when receiving the GSM 900 reception signal.

The configuration described above makes it possible to further reduce the number of circuit components of the high frequency front end module 10D.

Note that although an example in which a capacitor is connected at each location between two of the antenna side port CPc, the transmission side port CPt, and the reception side port CPr has been described above, it is sufficient that a single capacitor is connected between any two of the listed ports as long as such a configuration achieves the impedance adjusting function described above. In addition, although a configuration in which the phase is rotated by using a capacitor has been described above, the phase may be rotated by using a circuit element such as an inductor that enables impedance adjustment to be realized by another circuit configuration, and thus desired impedance adjustment is realized.

Note that although a SAW filter has been described as an example of the transmission side filter or the reception side filter in the description above, an elastic wave filter such as a BAW filter may be used in place of the SAW filter, for example. In particular, a filter that has a narrow pass band with steep attenuation characteristics at both ends of the pass band is desirable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency front end module configured to, by using a common antenna configured for a plurality of types of communication signals, transmit a transmission signal of the plurality of communication signals and receive a reception signal of the plurality of communication signals, the high frequency front end module comprising:
    a circulator including an antenna side port to be connected to the common antenna, a reception signal side port configured to output the reception signal, and a transmission side port configured to accept input of the transmission signal, the circulator being configured to transmit the transmission signal from the transmission side port to the antenna side port and transmit the reception signal from the antenna side port to the reception side port;
    a transmission side filter connected to the transmission side port of the circulator; and
    a reception side filter connected to the reception side port of the circulator; wherein
    the circulator includes an adjustment circuit configured to adjust, in accordance with the communication signals, transmission characteristics from the transmission side port to the antenna side port, transmission characteristics from the antenna side port to the reception side port, and blocking characteristics from the transmission side port to the reception side port; and
    the transmission side filter and the reception side filter each include a variable filter, of which a pass band and an attenuation band are adjustable in accordance with frequency bands of the communication signals.

2. The high frequency front end module according to claim 1, wherein the adjustment circuit includes at least one of a first variable impedance circuit connected between the transmission side port and the antenna side port, a second variable impedance circuit connected between the antenna side port and the reception side port, and a third variable impedance circuit connected between the transmission side port and the reception side port.

3. The high frequency front end module according to claim 2, wherein the first variable impedance circuit, the second variable impedance circuit, and the third variable impedance circuit are each a variable capacitance circuit.

4. The high frequency front end module according to claim 3, wherein each of the variable capacitance circuits includes:
    a switching element for the circulator; and
    a plurality of fixed capacitance capacitors to be selectively connected by the switching element for the circulator.

5. The high frequency front end module according to claim 1, wherein each of the variable filters includes:
    a plurality of SAW filters each having a pass band set for one of the frequency bands to be used by the plurality of types of communication signals; and
    a switching element configured to selectively connect the plurality of SAW filters.

6. The high frequency front end module according to claim 1, wherein each of the variable filters includes:
    a plurality of SAW filters each having a pass band set for one of the frequency bands to be used by the plurality of types of communication signals; and
    an impedance adjustment circuit configured to adjust impedance such that a communication signal to be transmitted is input or output only to or from a SAW filter that corresponds to the communication signal.

7. The high frequency front end module according to claim 6, wherein
the impedance adjustment circuit is connected to the plurality of SAW filters at a side of ports thereof that are connected to the circulator; and
the switching element is connected to the plurality of SAW filters at a side opposite to the ports that are connected to the circulator.

8. The high frequency front end module according to claim 6, wherein the impedance adjustment circuit includes a transmission line that is connected to the plurality of SAW filters and that has an adjustable electrical length.

9. The high frequency front end module according to claim 1, wherein the plurality of types of communication signals include Global System for Mobile Communications 850 communication signals, Global System for Mobile Communications 900 communication signals, Global System for Mobile Communications 1800 communication signals, Global System for Mobile Communications 1900 communication signals, and Wideband Code Division Multiple Access communication signals.

10. The high frequency front end module according to claim 1, wherein the adjustment circuit includes a switch and capacitors.

11. The high frequency front end module according to claim 1, wherein the transmission side filter includes switches and SAW filters.

12. The high frequency front end module according to claim 1, wherein the reception side filter includes switches and SAW filters.

13. The high frequency front end module according to claim 1, wherein the transmission side filter includes SAW filters and phase adjustment lines that connect the SAW filters to a transmission signal external input terminal and the transmission side port of the circulator.

14. The high frequency front end module according to claim 13, wherein at least one of the phase adjustment lines has an electrical length that rotates a phase such that impedance to one of the SAW filters as seen from the transmission signal external input terminal approaches infinity in the frequency band of the communication signals.

15. The high frequency front end module according to claim 1, wherein the reception side filter includes SAW filters and phase adjustment lines that connect the SAW filters to a transmission signal external input terminal and the transmission side port of the circulator.

16. The high frequency front end module according to claim 15, wherein at least one of the phase adjustment lines has an electrical length that rotates a phase such that impedance to one of the SAW filters as seen from the transmission signal external input terminal approaches infinity in the frequency band of the communication signals.

17. The high frequency front end module according to claim 1, wherein the adjustment circuit includes variable capacitance elements that each have an electrostatic capacitance that is adjustable through an applied voltage, and are defined by at least one of a Micro Electro Mechanical System element and a variable capacitance diode.

18. The high frequency front end module according to claim 1, wherein the transmission side filter is a variable filter having an adjustable structure such that a pass band and an attenuation band are adjustable through a control signal.

19. The high frequency front end module according to claim 1, wherein the reception side filter is a variable filter having an adjustable structure such that a pass band and an attenuation band are adjustable through a control signal.

20. A transmission/reception module comprising the high frequency front end module according to claim 1.

* * * * *